(12) United States Patent
Zhang et al.

(10) Patent No.: US 11,139,407 B2
(45) Date of Patent: Oct. 5, 2021

(54) METAL DENDRITE-FREE SOLAR CELL

(71) Applicant: The Boeing Company, Chicago, IL (US)

(72) Inventors: Xiaobo Zhang, Arcadia, CA (US); Vincent A. Lim, Los Angeles, CA (US); Hoon H. Lee, Valencia, CA (US); John P. Serra, Camarillo, CA (US); Uming T. Jeng, Rosemead, CA (US); Steven M. Bunyan, Northridge, CA (US); Julie J. Hoskin, Santa Monica, CA (US); Kent E. Barbour, Simi Valley, CA (US); Dimitri D. Krut, Encino, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/249,015

(22) Filed: Jan. 16, 2019

(65) Prior Publication Data
US 2019/0148572 A1 May 16, 2019

Related U.S. Application Data

(60) Division of application No. 15/488,618, filed on Apr. 17, 2017, now Pat. No. 10,224,440, which is a
(Continued)

(51) Int. Cl.
*H01L 31/0224* (2006.01)
*H01L 31/0475* (2014.01)
(Continued)

(52) U.S. Cl.
CPC .. *H01L 31/022433* (2013.01); *H01L 31/0475* (2014.12); *H01L 31/0508* (2013.01);
(Continued)

(58) Field of Classification Search
CPC ......... H01L 31/02008; H01L 31/02168; H01L 31/022425; H01L 31/022433;
(Continued)

(56) References Cited

U.S. PATENT DOCUMENTS

| 5,318,638 A | 6/1994 | Takehara |
| 10,224,440 B2 * | 3/2019 | Zhang ................. H01L 31/0475 |

(Continued)

OTHER PUBLICATIONS

European Patent Office, "Communication pursuant to Article 94(3) EPC," App. No. 13 159 060.6 (dated May 3, 2019).
(Continued)

*Primary Examiner* — Jose R Diaz
(74) *Attorney, Agent, or Firm* — Walters & Wasylyna LLC

(57) ABSTRACT

A method for forming a solar cell including steps of (1) providing a semiconductor wafer having an upper surface; (2) applying an electrical contact material to the upper surface, the electrical contact material forming an electrically conductive grid that includes grid lines extending from a bus bar; (3) forming an isolation channel in the semiconductor wafer to define a solar cell portion and a wing portion, wherein the wing portion is electrically isolated from the solar cell portion, and wherein the wing portion is substantially free of the electrical contact material; (4) submerging the semiconductor wafer in a solvent, wherein formation of metal dendrites on the grid lines of the electrically conductive grid is inhibited; and (5) separating the solar cell portion from the wing portion.

20 Claims, 5 Drawing Sheets

Related U.S. Application Data continuation of application No. 13/423,231, filed on Mar. 18, 2012, now abandoned.

(51) Int. Cl.
*H01L 31/068* (2012.01)
*H01L 31/18* (2006.01)
*H01L 31/05* (2014.01)

(52) U.S. Cl.
CPC ........ *H01L 31/068* (2013.01); *H01L 31/1804* (2013.01); *Y02E 10/547* (2013.01); *Y02P 70/50* (2015.11)

(58) Field of Classification Search
CPC .............. H01L 31/0463; H01L 31/0465; H01L 31/047; H01L 31/05; H01L 31/0512; H01L 31/068; H01L 31/1804; H01L 31/0508; H01L 31/0475
See application file for complete search history.

(56) References Cited

U.S. PATENT DOCUMENTS

| | | |
|---|---|---|
| 2010/0012175 A1 | 1/2010 | Varghese et al. |
| 2010/0065115 A1* | 3/2010 | Yata .................... H01L 31/0463 136/256 |
| 2010/0186813 A1* | 7/2010 | Knoll .................. H01L 31/0463 136/256 |
| 2010/0233839 A1* | 9/2010 | Cornfeld ............. H01L 31/0693 438/66 |
| 2013/0299829 A1* | 11/2013 | Ishikawa ............... H01L 31/046 257/53 |

OTHER PUBLICATIONS

European Patent Office, "Communication pursuant to Article 94(3) EPC," App. No. 13 159 060.6 (dated Mar. 16, 2020).

* cited by examiner

METAL DENDRITE-FREE SOLAR CELL

PRIORITY

This application is a divisional of U.S. Ser. No. 15/488,618 filed on Apr. 17, 2017, which is a continuation of U.S. Ser. No. 13/423,231 filed on Mar. 18, 2012.

FIELD

This application relates to solar cells, such as multijunction solar cells, and, more particularly, to solar cells that are substantially free of metal dendrites.

BACKGROUND

Solar cells convert the sun's energy into useful electrical energy by way of the photovoltaic effect. Modern multijunction solar cells operate at efficiencies significantly higher than traditional, silicon solar cells, with the added advantage of being lightweight. Therefore, solar cells provide a reliable, lightweight and sustainable source of electrical energy suitable for a variety of terrestrial and space applications.

A solar cell typically includes a semiconductor material having a certain energy bandgap. Photons in sunlight having energy greater than the bandgap of the semiconductor material are absorbed by the semiconductor material, thereby freeing electrons within the semiconductor material. The freed electrons diffuse through the semiconductor material and flow through a circuit as an electric current.

Unfortunately, various components of a solar cell may interfere with the absorption of photons by the semiconductor material, thereby lowering the overall efficiency of the solar cell. Therefore, those skilled in the art continue with research and development efforts in the field of solar cells and, particularly, with research and development efforts aimed at improving solar cell efficiency.

SUMMARY

In one aspect, the disclosed metal dendrite-free solar cell assembly may include a semiconductor wafer having a solar cell portion and a wing portion, wherein the wing portion is electrically isolated from the solar cell portion, and an electrical contact material positioned on the solar cell portion, wherein the wing portion is substantially free of the electrical contact material.

In another aspect, the disclosed metal dendrite-free solar cell assembly may include a semiconductor wafer having a solar cell portion and a wing portion, wherein the wing portion is electrically isolated from the solar cell portion, a first electrical contact material positioned on the solar cell portion and a second electrical contact material positioned on the wing portion, wherein the first electrical contact material is spaced at least 1 millimeter (or a few millimeters) from the second electrical contact material.

In one aspect, the disclosed method for forming a solar cell includes steps of (1) applying an electrical contact material to an upper surface of a semiconductor wafer, the electrical contact material forming an electrically conductive grid including a plurality of grid lines extending from a bus bar; (2) forming an isolation channel in the semiconductor wafer to define a solar cell portion and a wing portion, wherein the wing portion is electrically isolated from the solar cell portion, and wherein the wing portion is substantially free of the electrical contact material; (3) submerging the semiconductor wafer in a solvent, wherein formation of metal dendrites on the grid lines of the electrically conductive grid is inhibited; and (4) separating the solar cell portion from the wing portion.

In another aspect, disclosed is a method for forming a metal dendrite-free solar cell. The method may include the steps of (1) providing a semiconductor wafer, (2) applying an electrical contact material to the semiconductor wafer, (3) forming an isolation channel in the semiconductor wafer to define a solar cell portion and a wing portion, wherein the wing portion is electrically isolated from the solar cell portion, and wherein both the wing portion and the solar cell portion include the electrical contact material, (4) forming a spacer zone between the solar cell portion and the wing portion, the spacer zone being substantially free of the electrical contact material, wherein the spacer zone spaces the electrical contact material on the wing portion a minimum of at least 1 millimeter (or a few millimeters) from the electrical contact material on the solar cell portion, and/or (5) separating the solar cell portion from the wing portion.

Other aspects of the disclosed metal dendrite-free solar cell, solar cell assembly and method will become apparent from the following detailed description, the accompanying drawings and the appended claims.

DETAILED DESCRIPTION

Silver is often used in the manufacture of multiple junction solar cells as an electrical contact metal due to its high conductivity. Under fluorescent light illumination, which is used in most solar cell manufacturing environments, for a typical triple junction solar cell, the metal grid contact (front side) serves as the cathode of the cell, which has more negative charges than the silver metal contact on the wings due to more metal coverage and wafer perimeter electrical shunting. The silver ions from wings are transferred through aqueous medium to cell grids and reduced to silver dendrite by acquiring electrons. The silver dendrite introduces obscurity to sun light and reduces solar cell efficiency and compromises solar cell reliability. Therefore, disclosed are solar cell wafer front metal contact designs that reduce or eliminate silver dendrite growth on the metal grid.

Referring to FIGS. 1A-1E, disclosed is a metal dendrite-free solar cell shown during various stages of manufacture. While a single semiconductor wafer 10 is shown yielding two of the disclosed metal dendrite-free solar cells 12, 14 (FIGS. 1C and 1D) or solar cell assemblies (FIGS. 1C and 1E), those skilled in the art will appreciate that the semiconductor wafer 10 may yield only one solar cell or more than two solar cells without departing from the scope of the present disclosure.

Figure 1A:
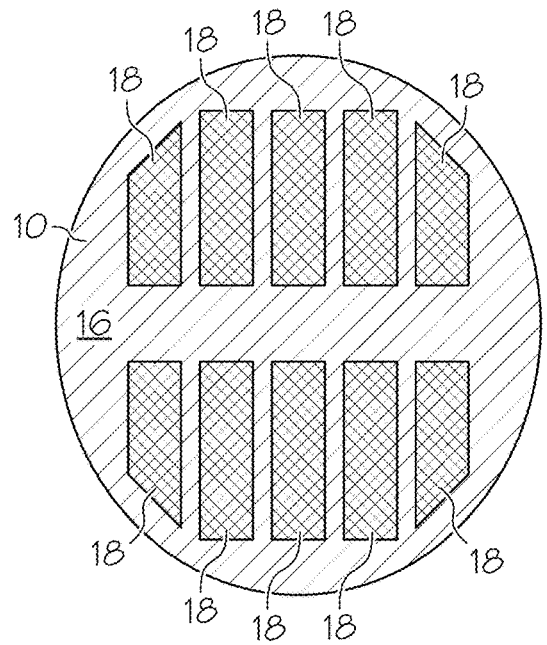
FIG. 1A is a schematic top plan view of a semiconductor wafer having an anti-reflection coating applied thereto during the manufacture of the disclosed metal dendrite-free solar cell.
Figure 1B:
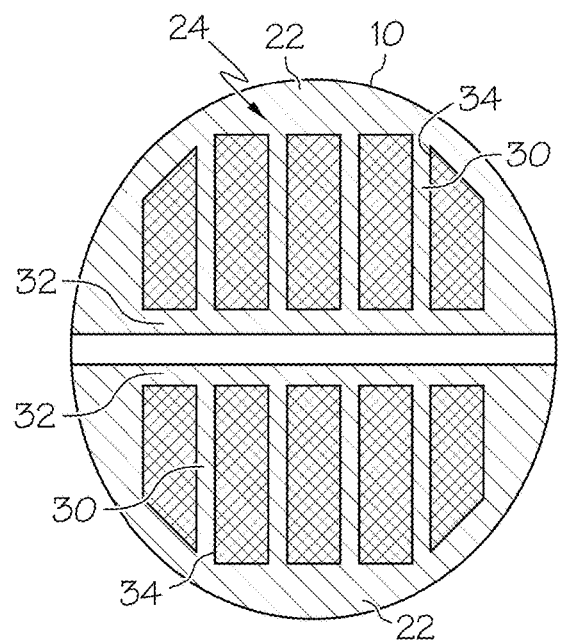
FIG. 1B is a schematic top plan view of the semiconductor wafer of FIG. 1A, shown with an electrical contact material applied thereto.
Figure 1C:
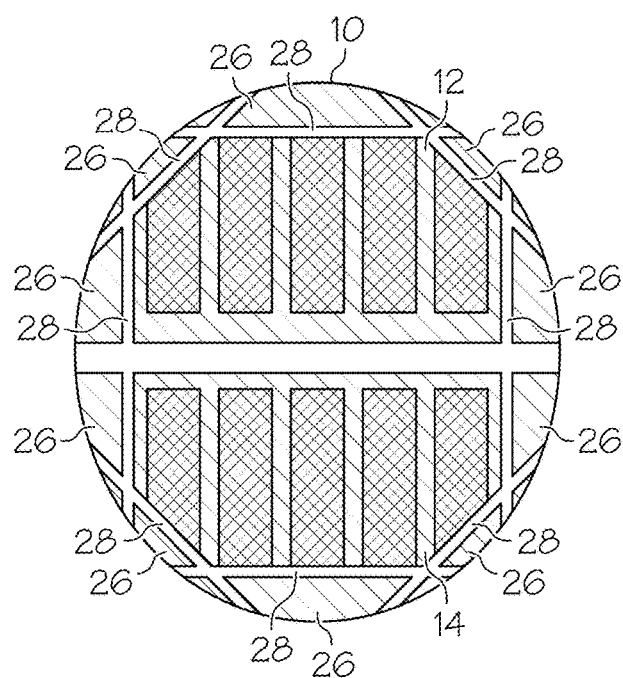
FIG. 1C is a schematic top plan view of the semiconductor wafer of FIG. 1B, shown with cell electrical isolation defining wafer wings.
Figure 1D:
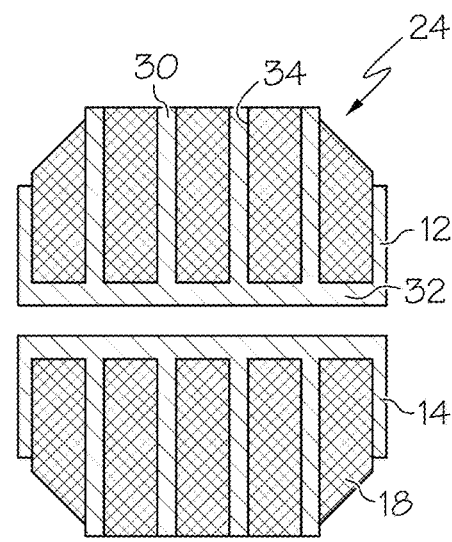
FIG. 1D is a schematic top plan view of the semiconductor wafer of FIG. 1C, shown after separation into two solar cells.
Figure 1E:
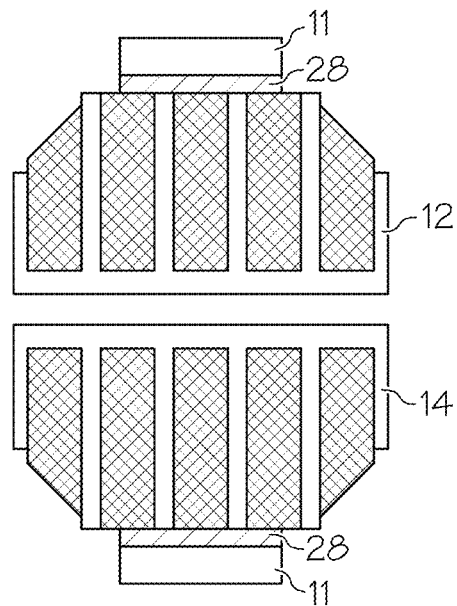
FIG. 1E is a schematic top plan view of the semiconductor wafer of FIG. 1C, shown after separation into two solar cell assemblies which comprise solar cells and other devices on the wings.

As shown in FIG. 1E, the solar cell assemblies 12, 14 may be monolithic integrated solar cells with various electronic devices 11, such as protecting diodes, formed on the wafer wings.

Figure 2:
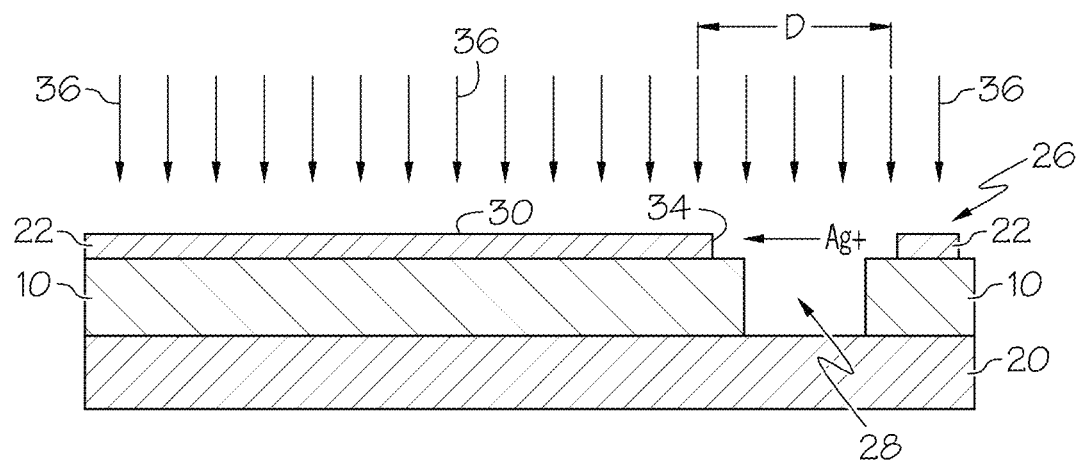
FIG. 2 is a schematic side elevational view, in section, of a solar cell assembly undergoing metal dendrite formation.

As shown in FIG. 1A, the semiconductor wafer 10 may have an upper surface 16, and may be grown on a substrate (see substrate 20 in FIG. 2). Portions of the upper surface 16 of the semiconductor wafer 10 may be coated with an anti-reflection coating 18. During the step of coating the upper surface 16 of the semiconductor wafer 10 with the anti-reflection coating 18, a masking material (not shown) may be applied over portions of the upper surface 16 such that only the desired portions of the upper surface 16 (i.e., the active portions) receive the anti-reflection coating 18.

As shown in FIG. 1B, an electrical contact material 22 may be applied to portions of the upper surface 16 of the semiconductor wafer 10. During the step of applying the electrical contact material 22 to the upper surface 16 of the semiconductor wafer 10, a masking material (not shown) may be applied over portions of the upper surface 16 such that only the desired portions of the upper surface 16 receive the electrical contact material 22. For example, the masking material may cover the anti-reflection coating 18 and, optionally, the areas of the semiconductor wafer 10 where isolation channels will be formed during the electrical isolation step.

The electrical contact material 22 may be any electrically conductive material capable of being applied to the upper surface 16 of the semiconductor wafer 10. In one general expression, the electrical contact material 22 may be an electrically conductive metal or metal alloy. In another general expression, the electrical contact material 22 may be a highly electrically conductive metal or metal alloy. In one particular expression, the electrical contact material 22 may be silver.

Thus, the electrical contact material 22 may form an electrically conductive grid 24 on the upper surface 16 of the semiconductor wafer 10. The electrically conductive grid 24 may include grid lines 30 extending from a bus bar 32. Each grid line 30 may terminate at a grid tip 34.

As shown in FIG. 1C, the solar cells 12, 14 may be electrically isolated from the wafer wings 26. Electrical isolation of the solar cells 12, 14 from the wafer wings 26 may be effected by forming one or more isolation channels 28 in the semiconductor wafer 10. The isolation channels 28 may extend through the semiconductor wafer 10 down to the underlying substrate 20.

Finally, as shown in FIGS. 1D and 1E, with the solar cells 12, 14 electrically isolated from the wafer wings 26, the solar cells 12, 14 may be separated. During separation, each solar cell 12, 14 may be separated from the adjacent solar cell 12, 14, and may or may not be separated from the wafer wings 26. Separation may be effected by cutting or other available means.

It has been discovered that metal dendrites, such as silver dendrites, may form on the grid lines 30 of the electrically conductive grid 24, particularly on the grid tips 34 of the grid lines 30, after the solar cells 12, 14 have been electrically isolated from the wafer wings 26, as shown in FIG. 1C, and submerged in a solvent (e.g., deionized water). Metal dendrite growth may be particularly pronounced in certain solar cell fabrication processes, such as metal lift off at elevated temperatures after solar cell electrical isolation.

Metal dendrites may obscure the passage of light to the underlying semiconductor wafer 10, thereby negatively impacting solar cell efficiency. Furthermore, metal dendrites may compromise solar cell reliability, particularly if the metal dendrites grow beyond the cap layer and contact the window layer of the solar cell structure.

The mechanism of silver dendrite growth is shown in FIG. 2, which is a cross-sectional view of a portion of a solar cell wafer taken along a grid line 30. Under certain lighting conditions, such as the fluorescent light 36 typically found in the solar cell manufacturing environment, the grid lines 30 (silver) serve as a cathode, which has more negative charges than the electrical contact material 22 (silver) on the wafer wings 26 due to more electrical contact material coverage and wafer perimeter electrical shunting. Therefore, silver ions may transfer from the wafer wings 26, across the isolation channels 28 through the solvent (e.g., deionized water) and, ultimately, to the grid lines 30. At the grid lines 30, the silver ions may acquire electrons and may be reduced to silver, which may accumulate on the grid lines 30 as silver dendrite.

Multiple factors may affect metal dendrite growth, including, but not limited to, the type of electrical contact material 22 used (e.g., silver), the geometry of the electrical contact material 22 on the solar cells 12, 14 and the wafer wings 26, the illumination condition, solar cell shunting resistance, and the type of solvent in which solar cell assembly is submerged. Many of these factors are dictated by the cell fabrication process being used to manufacture the solar cells 12, 14.

Dendrite growth rate is proportional to the electric field intensity between the solar cells 12, 14 and the wafer wings 26. The electrical potential difference between the solar cells 12, 14 and the wafer wings 26 may be generally constant at fixed light condition. Therefore, the shorter the distance D (FIG. 2) between the grid lines 30 and the electrical contact material 22 on the wafer wings 26, the higher the electric field intensity that drives metal dendrite growth.

Figure 3A:
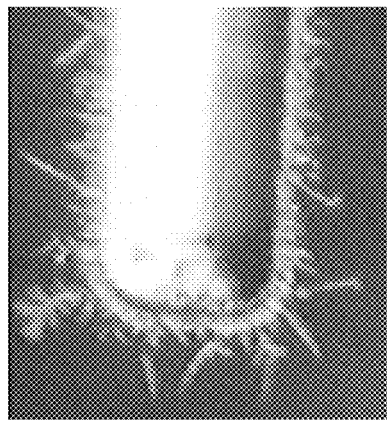
FIG. 3A is a photograph of a silver grid tip that was spaced 288 µm from silver on a wafer wing during manufacture of a solar cell.
Figure 3B:
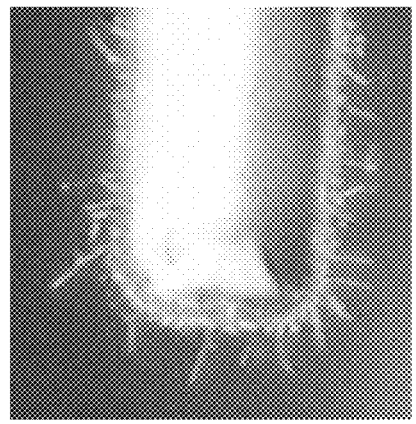
FIG. 3B is a photograph of a silver grid tip that was spaced 438 µm from silver on a wafer wing during manufacture.
Figure 3C:
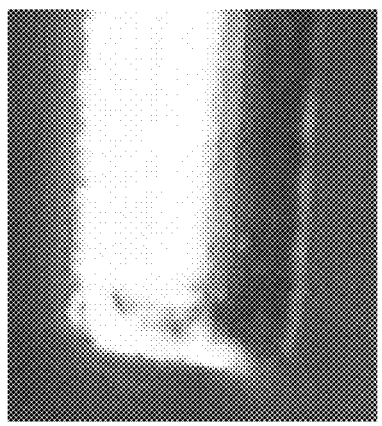
FIG. 3C is a photograph of a silver grid tip that was spaced 1038 µm from silver on a wafer wing during manufacture of a solar cell.
Figure 3D:
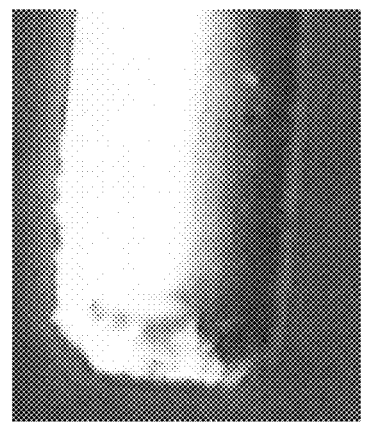
FIG. 3D is a photograph of a silver grid tip that was spaced 3438 µm from silver on a wafer wing during manufacture of a solar cell.

To show the effect that the minimum distance D (FIG. 2) between the grid lines 30 and the electrical contact material 22 on the wafer wings 26 has on metal dendrite growth, four different wafer specimens were prepared with silver grid lines terminating at a tip, wherein the minimum distance D of the first specimen was 288 μm (FIG. 3A), the minimum distance D of the second specimen was 438 μm (FIG. 3B), the minimum distance D of the third specimen was 1038 μm (FIG. 3C) and the minimum distance D of the fourth specimen was 3438 μm (FIG. 3D). The specimens were submerged in isopropyl alcohol for 20 minutes under fluorescent room lighting conditions. The electrical potential difference between the cell and wafer wing was 1.83 volts. After the twenty minute bath, the grid tips were observed under 500 times magnification. The results are shown in FIGS. 3A-3D.

As can be seen in FIGS. 3A-3D, metal dendrite growth was reduced as the minimum distance D (FIG. 2) between the grid lines 30 and the electrical contact material 22 on the wafer wings 26 increased. Significantly, little or no metal dendrite growth was observed when the distance D was about 1 mm (FIG. 3C), while no metal dendrite growth was observed when the distance D was about 3 mm (FIG. 3D).

In addition to the distance D between the grid lines 30 and the electrical contact material 22 on the wafer wings 26, the orientation of the electrically conductive grid 24 may also have a significant impact on the growth rate of metal dendrites. The metal dendrites tend to deposit at sharp edges, specifically at the tips 34 of the grid lines 30. Without being limited to any particular theory, it is believed that the preference of dendrites to deposit on grid tips 34 is because direct current ("DC") flows more densely to the sharp edges of the grid tips 34 than the less accessible portions of the electrically conductive grid 24.

In a first embodiment, growth of metal dendrites on solar cell grid lines may be significantly reduced or eliminated by forming the solar cell assembly such that the wafer wings are substantially free of the electrical contact material.

Figure 4:
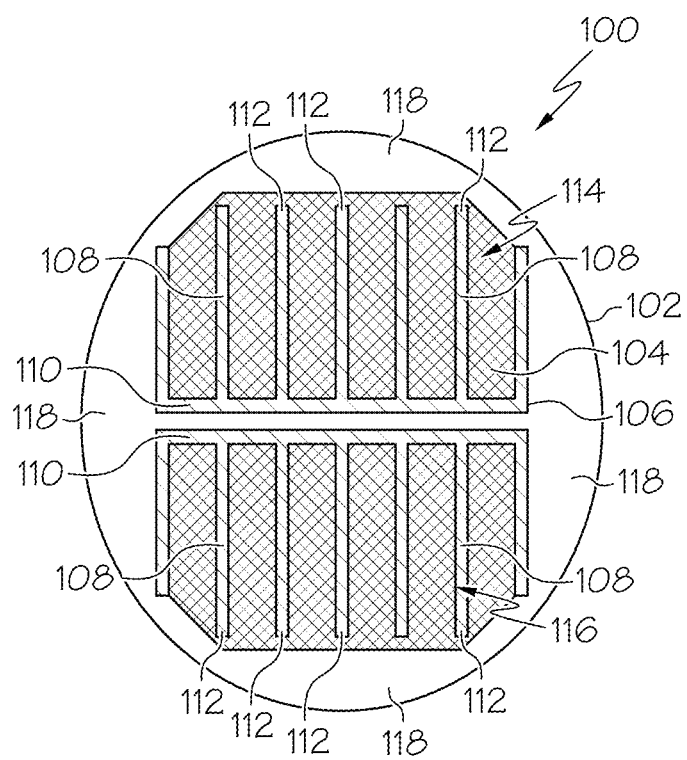
FIG. 4 is a top plan view of a first implementation of a first embodiment of the disclosed metal dendrite-free solar cell.

Referring to FIG. 4, in a first implementation of the first embodiment, a solar cell assembly, generally designated 100, may include a semiconductor wafer 102, an anti-reflection coating 104 and an electrical contact material 106. The electrical contact material 106 may be applied in a grid pattern to form grid lines 108. The grid lines 108 may extend outward from a bus bar 110 and may terminate at a tip 112.

Isolation channels (see channel 28 in FIG. 2) may be formed in the solar cell assembly 100 to define and electrically isolate two solar cells 114, 116 from wafer wings 118. The wafer wings 118 may be substantially free of the electrical contact material 106 (e.g., silver) used to form the grid lines 108.

Thus, despite the tips 112 of the grid lines 108 protruding toward the wafer wings 118, the lack of electrical contact material 106 on the wafer wings 118 may preclude (or at least inhibit) the formation of metal dendrites on the grid lines 108. Therefore, when the solar cells 114, 116 are separated from the solar cell wafer, as discussed above in connection with FIG. 1D, each solar cell 114, 116 may be substantially free of metal dendrites.

Figure 5:
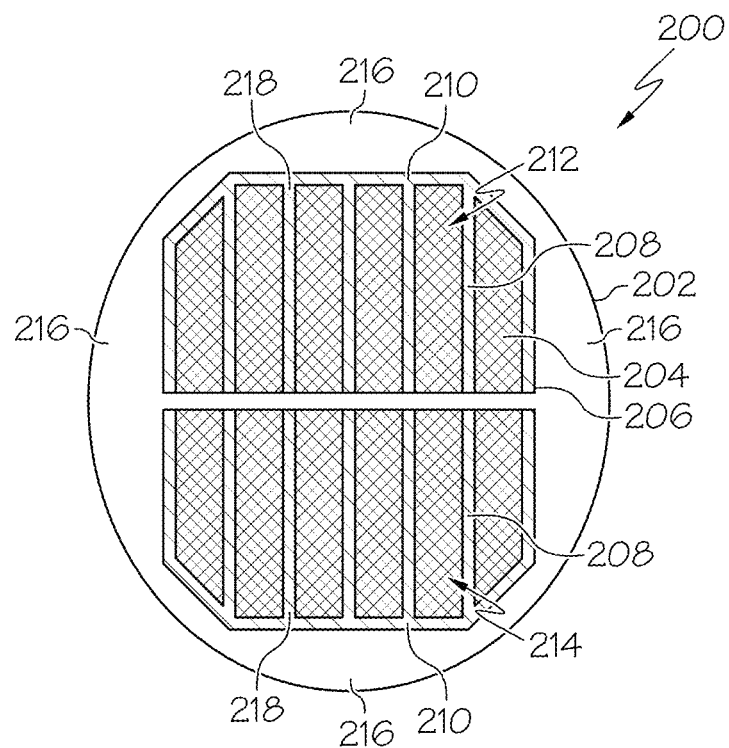
FIG. 5 is a top plan view of a second implementation of the first embodiment of the disclosed metal dendrite-free solar cell.

Referring to FIG. 5, in a second implementation of the first embodiment, a solar cell assembly, generally designated 200, may include a semiconductor wafer 202, an anti-reflection coating 204 and an electrical contact material 206. The electrical contact material 206 may be applied in a grid pattern to form grid lines 208 that extend inward from a bus bar 210.

Isolation channels may be formed in the solar cell assembly 200 to define and electrically isolate two solar cells 212, 214 from wafer wings 216. The wafer wings 216 may be substantially free of the electrical contact material 206 (e.g., silver) used to form the grid lines 208.

Thus, the lack of electrical contact material 206 on the wafer wings 216 may preclude (or at least inhibit) the formation of metal dendrites on the grid lines 208. Furthermore, in the second implementation, the grid lines 208 do not protrude toward, and open to, the wafer wings 216. Rather, the outer ends 218 of the grid lines 208 terminate at the bus bar 210 and, as such, do not present a sharp tip to the wafer wings 216, thereby further reducing the potential for dendrite formation on the grid lines 208. Therefore, when the solar cells 212, 214 are separated from the solar cell assembly 200, each solar cell 212, 214 may be substantially free of metal dendrites.

In a second embodiment, growth of metal dendrites on solar cell grid lines may be significantly reduced or eliminated by providing a spacer zone between the grid lines and the electrical contact material on the wafer wings, wherein the spacer zone is substantially free of the electrical contact material.

Figure 6:
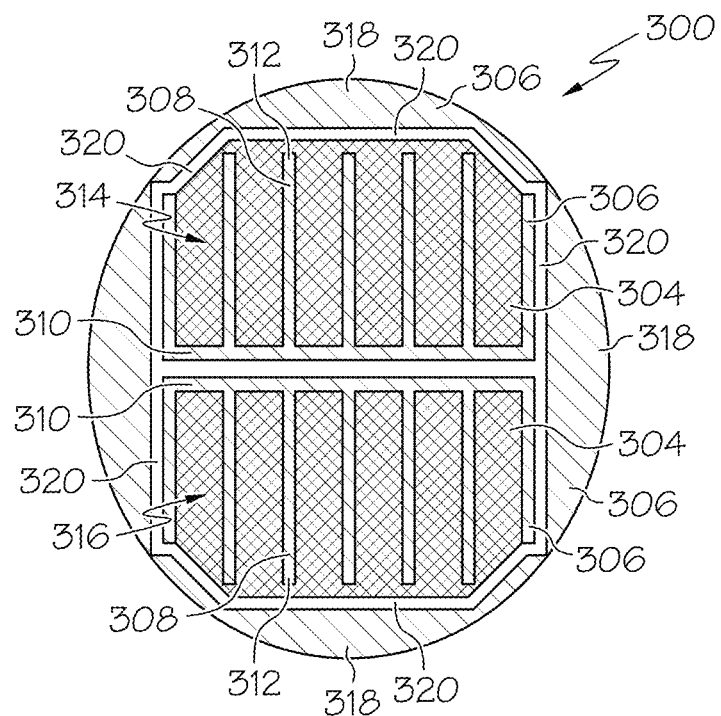
FIG. 6 is a top plan view of a first implementation of a second embodiment of the disclosed metal dendrite-free solar cell.

Referring to FIG. 6, in a first implementation of the second embodiment, a solar cell assembly, generally designated 300, may include a semiconductor wafer 302, an anti-reflection coating 304 and an electrical contact material 306. The electrical contact material 306 may be applied in a grid pattern to form grid lines 308. The grid lines 308 may extend outward from a bus bar 310 and may terminate at a tip 312.

Isolation channels may be formed in the solar cell assembly 300 to define and electrically isolate two solar cells 314, 316 from wafer wings 318. The wafer wings 318 may include the electrical contact material 306 (e.g., silver) used to form the grid lines 308.

At this point, those skilled in the art will appreciate that in certain situations the electrical contact material 306 cannot feasibly be eliminated from the wafer wings 318. For example, a test structure or other type of devices with electrical contact material 306 on the wafer wings 318 may be required or some electrical contact material 306 may be left on the wafer wings 318 to simplify the metal lift off process.

Therefore, a spacer zone 320 may be formed around the solar cells 314, 316 to space the electrical contact material 306 on the solar cells 314, 316, particularly the tips 312 of the grid lines 308, from the electrical contact material 306 on the wafer wings 318. The spacer zone 320 may be substantially free of the electrical contact material 306.

In one expression, the spacer zone 320 may be size and shaped to ensure a minimum distance of at least 1 millimeter between the electrical contact material 306 on the solar cells 314, 316 and the electrical contact material 306 on the wafer wings 318. In another expression, the spacer zone 320 may be size and shaped to ensure a minimum distance of at least 1.5 millimeters between the electrical contact material 306 on the solar cells 314, 316 and the electrical contact material 306 on the wafer wings 318. In another expression, the spacer zone 320 may be size and shaped to ensure a minimum distance of at least 2 millimeters between the electrical contact material 306 on the solar cells 314, 316 and the electrical contact material 306 on the wafer wings 318. In another expression, the spacer zone 320 may be size and shaped to ensure a minimum distance of at least 2.5 millimeters between the electrical contact material 306 on the solar cells 314, 316 and the electrical contact material 306 on the wafer wings 318. In yet another expression, the spacer zone 320 may be size and shaped to ensure a minimum distance of at least 3 millimeters between the electrical contact material 306 on the solar cells 314, 316 and the electrical contact material 306 on the wafer wings 318.

Thus, despite the tips 312 of the grid lines 308 protruding toward, and opening to, the wafer wings 318, the spacer zone 320 may preclude (or at least inhibit) the formation of metal dendrites on the grid lines 308. Therefore, when the solar cells or solar cell assemblies 314, 316 are separated from the wafer, each solar cell 314, 316 may be substantially free of metal dendrites.

Figure 7:
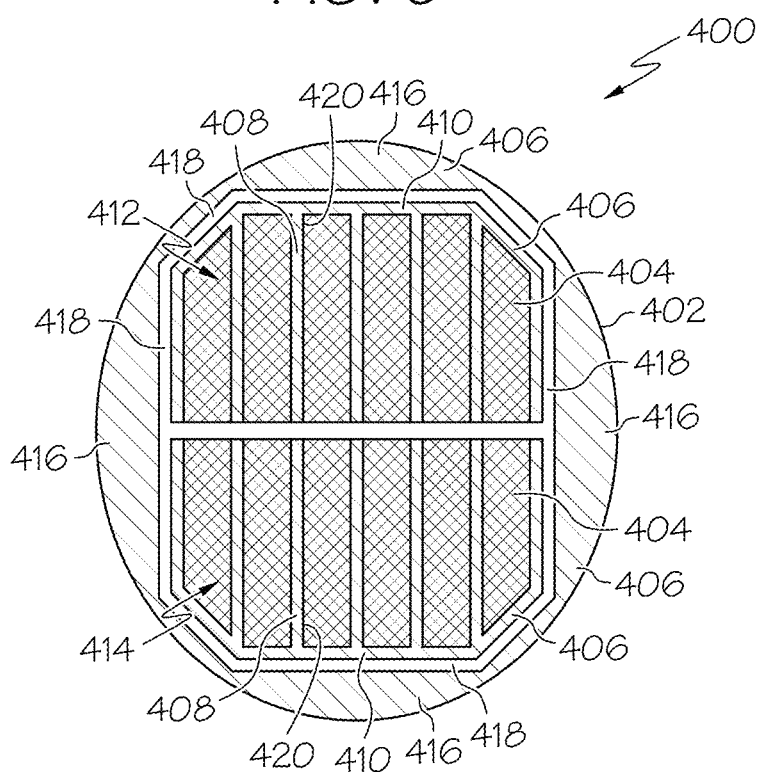
FIG. 7 is a top plan view of a second implementation of the second embodiment of the disclosed metal dendrite-free solar cell.

Referring to FIG. 7, in a second implementation of the second embodiment, a solar cell assembly, generally designated 400, may include a semiconductor wafer 402, an anti-reflection coating 404 and an electrical contact material 406. The electrical contact material 406 may be applied in a grid pattern to form grid lines 408 that extend inward from a bus bar 410.

Isolation channels may be formed in the solar cell wafer 402 to define and electrically isolate two solar cells 412, 414 from wafer wings 416. The wafer wings 416 may include the electrical contact material 406 (e.g., silver) used to form the grid lines 408.

A spacer zone 418 may be formed around the solar cells 412, 414 to space the electrical contact material 406 on the solar cells 412, 414 from the electrical contact material 406 on the wafer wings 416. The spacer zone 418 may be substantially free of the electrical contact material 406.

In one expression, the spacer zone 418 may be size and shaped to ensure a minimum distance of at least 1 millimeter between the electrical contact material 406 on the solar cells 412, 414 and the electrical contact material 406 on the wafer wings 416. In another expression, the spacer zone 418 may be size and shaped to ensure a minimum distance of at least 1.5 millimeter between the electrical contact material 406 on the solar cells 412, 414 and the electrical contact material 406 on the wafer wings 416. In another expression, the spacer zone 418 may be size and shaped to ensure a minimum distance of at least 2 millimeter between the electrical contact material 406 on the solar cells 412, 414 and the electrical contact material 406 on the wafer wings 416. In another expression, the spacer zone 418 may be size and shaped to ensure a minimum distance of at least 2.5 millimeter between the electrical contact material 406 on the solar cells 412, 414 and the electrical contact material 406 on the wafer wings 416. In another expression, the spacer zone 418 may be size and shaped to ensure a minimum distance of at least 3 millimeter between the electrical contact material 406 on the solar cells 412, 414 and the electrical contact material 406 on the wafer wings 416.

Thus, the spacer zone 418 may preclude (or at least inhibit) the formation of metal dendrites on the grid lines 408. Furthermore, since the grid lines 408 do not protrude toward, and open to, the wafer wings 416, but rather the outer ends 420 of the grid lines 408 terminate at the bus bar 410, no sharp tips are presented to the wafer wings 416, thereby further reducing the potential for dendrite formation on the grid lines 408. Therefore, when the solar cells or solar cell assemblies are separated from the wafer, each solar cell 412, 414 may be substantially free of metal dendrites.

Accordingly, the disclosed solar cell may be substantially free of metal dendrites, including silver dendrites. Furthermore, the disclosed method for manufacturing solar cells may result in solar cells that are substantially free of metal dendrites, including silver dendrites.

Although various aspects of the disclosed metal dendrite-free solar cell have been shown and described, modifications may occur to those skilled in the art upon reading the specification. The present application includes such modifications and is limited only by the scope of the claims.

What is claimed is:

1. A solar cell assembly manufactured by a method comprising:
   applying an electrical contact material to an upper surface of a semiconductor wafer, said electrical contact material forming an electrically conductive grid comprising a plurality of grid lines extending from a bus bar;
   forming an isolation channel in said semiconductor wafer to define a solar cell portion and a wing portion, wherein said wing portion is electrically isolated from said solar cell portion, and wherein said wing portion is substantially free of said electrical contact material;
   submerging said semiconductor wafer in a solvent comprising isopropyl alcohol for at least 20 minutes, wherein said solvent contacts said grid lines of said electrically conductive grid during said submerging;
   during said submerging, illuminating said electrically conductive grid with fluorescent room lighting; and
   separating said solar cell portion from said wing portion, wherein said electrically conductive grid is substantially metal dendrite free after 20 minutes of said submerging.

2. The solar cell assembly of claim 1 wherein said method further comprising illuminating said semiconductor wafer while said semiconductor wafer is submerged in said solvent.

3. The solar cell assembly of claim 2 wherein said illuminating said semiconductor wafer comprises exposing said semiconductor wafer to fluorescent light.

4. The solar cell assembly of claim 1 wherein said solvent is an aqueous solvent.

5. The solar cell assembly of claim 1 wherein said solvent comprises deionized water.

6. The solar cell assembly of claim 1 wherein said electrical contact material is a metal or metal alloy.

7. The solar cell assembly of claim 1 wherein said electrical contact material comprises silver.

8. The solar cell assembly of claim 1 wherein at least one grid line of said plurality of grid lines comprises a tip, wherein said tip protrudes toward said wing portion.

9. The solar cell assembly of claim 1 wherein at least one grid line of said plurality of grid lines comprises an outer end, and wherein said bus bar is positioned between said outer end and said wing portion.

10. The solar cell assembly of claim 1 wherein said method further comprising applying an anti-reflection coating to said upper surface of said semiconductor wafer prior to said applying said electrical contact material to said upper surface of said semiconductor wafer.

11. A solar cell assembly comprising:
    a semiconductor wafer comprising an upper surface, a solar cell portion, and a wing portion, wherein said wing portion is electrically isolated from said solar cell portion;
    a first electrical contact material positioned on the upper surface of said solar cell portion of the semiconductor wafer; and
    a second electrical contact material positioned on the upper surface of said wing portion of the semiconductor wafer,
    wherein said first electrical contact material is spaced at least 1 millimeter from said second electrical contact material, and
    wherein the solar cell assembly is substantially free of metal dendrites.

12. The solar cell assembly of claim 11 wherein said solar cell portion is separated from said wing portion by a spacer zone, and wherein said spacer zone is substantially free of said first electrical contact material and said second electrical contact material.

13. The solar cell assembly of claim 11 wherein said first electrical contact material is spaced at least 1.5 millimeters from said second electrical contact material.

14. The solar cell assembly of claim 11 wherein said first electrical contact material is spaced at least 2 millimeters from said second electrical contact material.

15. The solar cell assembly of claim 11 wherein said first electrical contact material is spaced at least 2.5 millimeters from said second electrical contact material.

16. The solar cell assembly of claim 11 wherein said first electrical contact material is spaced at least 3 millimeters from said second electrical contact material.

17. The solar cell assembly of claim 11 wherein both said first electrical contact material and said second electrical contact material comprise silver.

18. The solar cell assembly of claim 11 wherein said first electrical contact material is arranged in a grid pattern comprising a plurality of grid lines extending from a bus bar.

19. The solar cell assembly of claim 18 wherein at least one grid line of said plurality of grid lines comprises a tip, wherein said tip protrudes toward said wing portion.

20. The solar cell assembly of claim 18 wherein at least one grid line of said plurality of grid lines comprises an outer end, and wherein said bus bar is positioned between said outer end and said wing portion.

* * * * *